(12) United States Patent
Cranford, Jr. et al.

(10) Patent No.: US 9,571,111 B1
(45) Date of Patent: Feb. 14, 2017

(54) SYSTEM AND METHOD TO SPEED UP PLL LOCK TIME ON SUBSEQUENT CALIBRATIONS VIA STORED BAND VALUES

(71) Applicant: GLOBALFOUNDRIES, INC., Grand Cayman (KY)

(72) Inventors: Hayden C. Cranford, Jr., Cary, NC (US); Venkatasreekanth Prudvi, Bangalore (IN); Rajesh Agraramachandrarao, Bengaluru (IN); Sandeep Tippannanavar, Bangalore (IN); Neelamekakannan Alagarsamy, Bangalore (IN)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/964,327

(22) Filed: Dec. 9, 2015

(51) Int. Cl.
 *H03L 7/06* (2006.01)
 *H03L 7/10* (2006.01)
 *H03L 7/08* (2006.01)

(52) U.S. Cl.
 CPC ............. *H03L 7/101* (2013.01); *H03L 7/0805* (2013.01)

(58) Field of Classification Search
 CPC ....................................................... H03L 7/101
 See application file for complete search history.

(56) References Cited

U.S. PATENT DOCUMENTS

| 7,539,473 B2 | 5/2009 | Cranford, Jr. et al. |
| 2003/0215045 A1* | 11/2003 | Nagata ................... H03L 7/113 375/376 |

* cited by examiner

*Primary Examiner* — Daniel Puentes
(74) *Attorney, Agent, or Firm* — Scully Scott Murphy and Presser

(57) ABSTRACT

A method and apparatus and computer program product for calibrating a Phase Lock Loop (PLL) that reduces a PLL lock time for subsequent calibrations to thereby improve an overall system time and latency. The system and method for calibrating obviates effect of Process, Voltage and Temperature to achieve a faster PLL lock.

17 Claims, 6 Drawing Sheets

US 9,571,111 B1

SYSTEM AND METHOD TO SPEED UP PLL LOCK TIME ON SUBSEQUENT CALIBRATIONS VIA STORED BAND VALUES

FIELD

The present disclosure generally relates to circuits and systems employing phase-locked loop (PLL) devices, and particularly apparatus and method to calibrate a PLL device and speed up a PLL lock time on subsequent calibrations via stored band values.

BACKGROUND

Traditionally, any electronic system or apparatus which has an internal phase-locked loop will try first achieving the lock before doing any other calibration. To achieve a lock, the apparatus or system initiates a PLL Calibration engine which will try to find the best solution for the frequency band.

This frequency band information even though readily available which can be loaded to get a faster PLLLOCK is not recommended as the simulation result of the frequency band may not match with real hardware due to the process variations. The PLL typically takes a few milliseconds to achieve the lock.

In case of subsequent system reset, the PLL(s) must undergo re-calibration and achieve the lock after iterating through the frequency bands which will consume the time (the aforementioned few milliseconds).

It would be highly desirable to avoid this PLL lock time of the aforementioned few milliseconds when implementing a subsequent PLL calibration.

SUMMARY

In one aspect there is provided a phase lock loop (PLL) calibration apparatus and method to reduce the PLL lock calibration time on any subsequent assertion of hard or soft reset without the intervention of the user.

In one aspect, there is provided a phase lock loop (PLL) calibration apparatus for phased lock loop (PLL) circuit having a voltage controlled oscillator providing an output frequency. The apparatus comprises: a logic circuit for setting an initial frequency band value for use in calibrating a PLL circuit, and iteratively incrementing the frequency band value settings for the PLL circuit calibrating until achieving a PLL circuit lock condition at a particular operating frequency; and a memory storage device operably coupled to the logic circuit for storing the frequency band value setting upon achieving the PLL circuit lock condition, wherein, upon a subsequent calibration of the PLL circuit, the logic circuit using the frequency band value setting stored in the memory storage device as the initial frequency, wherein the PLL lock in the subsequent calibration is achieved in a reduced amount of time.

In a further aspect, there is provided a method of calibrating a phase lock loop (PLL) circuit having a voltage controlled oscillator providing an output frequency. The method comprises: setting, at a calibration logic circuit device, an initial frequency band value for use in calibrating a PLL circuit, and during PLL calibrating, iteratively incrementing the frequency band value settings until achieving a PLL circuit lock condition at a particular operating frequency; and storing, in a memory storage device operably coupled to the logic circuit, the frequency band value setting upon achieving the PLL circuit lock condition, wherein, upon a subsequent calibration of the PLL circuit, the logic circuit device using the frequency band value setting stored in the memory storage device as the initial frequency, wherein the PLL lock in the subsequent calibration is achieved in a reduced amount of time.

In a further aspect, there is provided a computer program product for performing operations. The computer program product includes a storage medium readable by a processing circuit and storing instructions run by the processing circuit for running a method. The method is the same as listed above.

BRIEF DESCRIPTION OF THE DRAWINGS

The objects, features, and advantages of the present disclosure will become more clearly apparent when the following description is taken in conjunction with the accompanying drawings.

DETAILED DESCRIPTION

Figure 1:
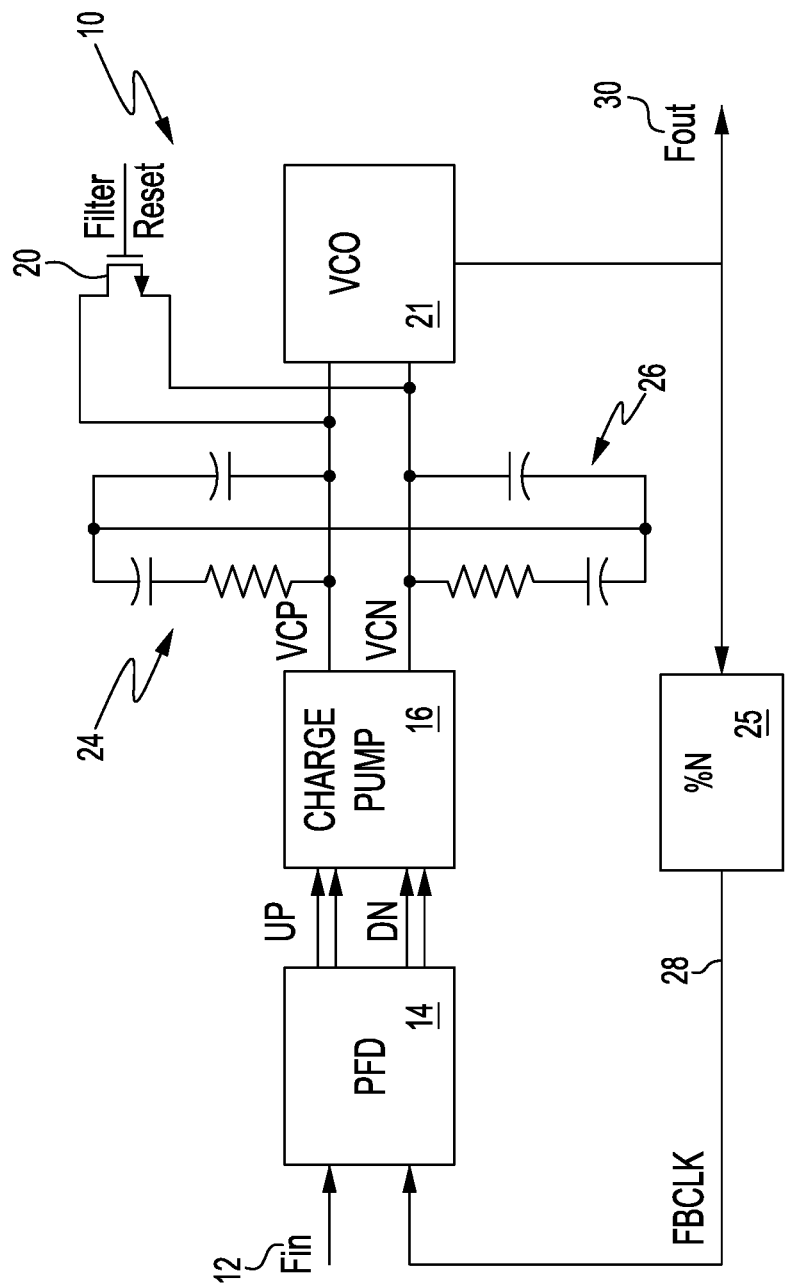
FIG. 1 shows a block diagram of a PLL circuit 10 in which a method to reduce the PLL lock calibration time may be employed in one embodiment.

FIG. 1 shows a block diagram of a PLL circuit 10 in which the present disclosure may be employed. The PLL circuitry 10 of FIG. 1 represents a frequency multiplier phase locked loop (PLL) and includes a phase frequency detector (PFD) 14, charge pump (CP)/low pass filter (LPF) 16, differential loop filter (24,26), then VCO 21 to produce an output frequency (Fout) 12. Additionally, output from VCO 21 is provided through feedback loop 215, which includes divide-by-N (divider) 25. The output of divider 25 is fed as a second input into PFD 14. As illustrated, each branch of differential loop filter (24, 26) with positive voltage controlled branch (VCP) 24 and negative voltage controlled branch (VCN) 26, with each branch including a resistor and two capacitors, utilized to hold the respective lower or upper charge generated by charge pump 16. The magnitude of the voltage values between VCP and VCN determines the frequency of VCO 21.

PLL circuitry 10 of FIG. 1 is further designed with enhanced mechanisms for correcting frequency overshoot caused by VCO calibration without requiring an over-designed divider circuit. Specifically, the circuit 10 includes a filter reset component 20 providing a mechanism for resetting the VCO frequency to the center point by shorting the two sides of the loop filter together. This resetting of the VCO frequency to the center point assures that the VCO frequency does not exceed the capability of the feedback divider 14. In the illustrative embodiment, the reset component 20 comprises a transistor, which is coupled at the gate and source terminals to positive and negative inputs of VCO 21. Each time a band is selected, the gate of the transistor is taken to a high voltage (which shorts the transistor's sides together to a common voltage) and this operation resets the PLL to a known frequency.

During calibration, an input frequency signal (Fin) 12 is passed through (and/or influenced by) the sequence of circuit components, namely phase frequency detector (PFD) 14, charge pump (CP)/low pass filter (LPF) 16, differential loop filter (24,26), then VCO 21 to produce an output frequency (Fout) 30. Additionally, output from VCO 21 is provided through feedback loop 28, which includes divide-by-N (divider) 25. The output of divider 25 is fed as a second input into PFD 14. The difference in lower and upper charges held by each branch of differential loop filter (24, 26), i.e., the magnitude of the difference in voltage values between VCP and VCN, determines the frequency of VCO 21. With this configuration, the present circuit 10 accurately tracks the VCO 21, while consuming less power, requiring less area on the chip/circuit board, and prevents erroneous lock conditions.

In one embodiment of the disclosure, the time-consuming requirement that the PLL undergoing re-calibration achieves a lock after iterating through the frequency bands is obviated.

In one embodiment, a circuit and method are provided to enable a faster restart by utilizing stored information and at the same time forcing the control voltage to a "midpoint", hence not allowing the frequency to be too "fast" for the feedback divider 25. The method starts over each time PLL circuit 10 is reset and the phase/frequency lock process is invoked. Thus for PLL calibration, the method starts at the midpoint of the frequency band or determines the need to start searching at the previously locked band, e.g., band "n" (where n is a number of bands lower than the locked band).

Figure 2:
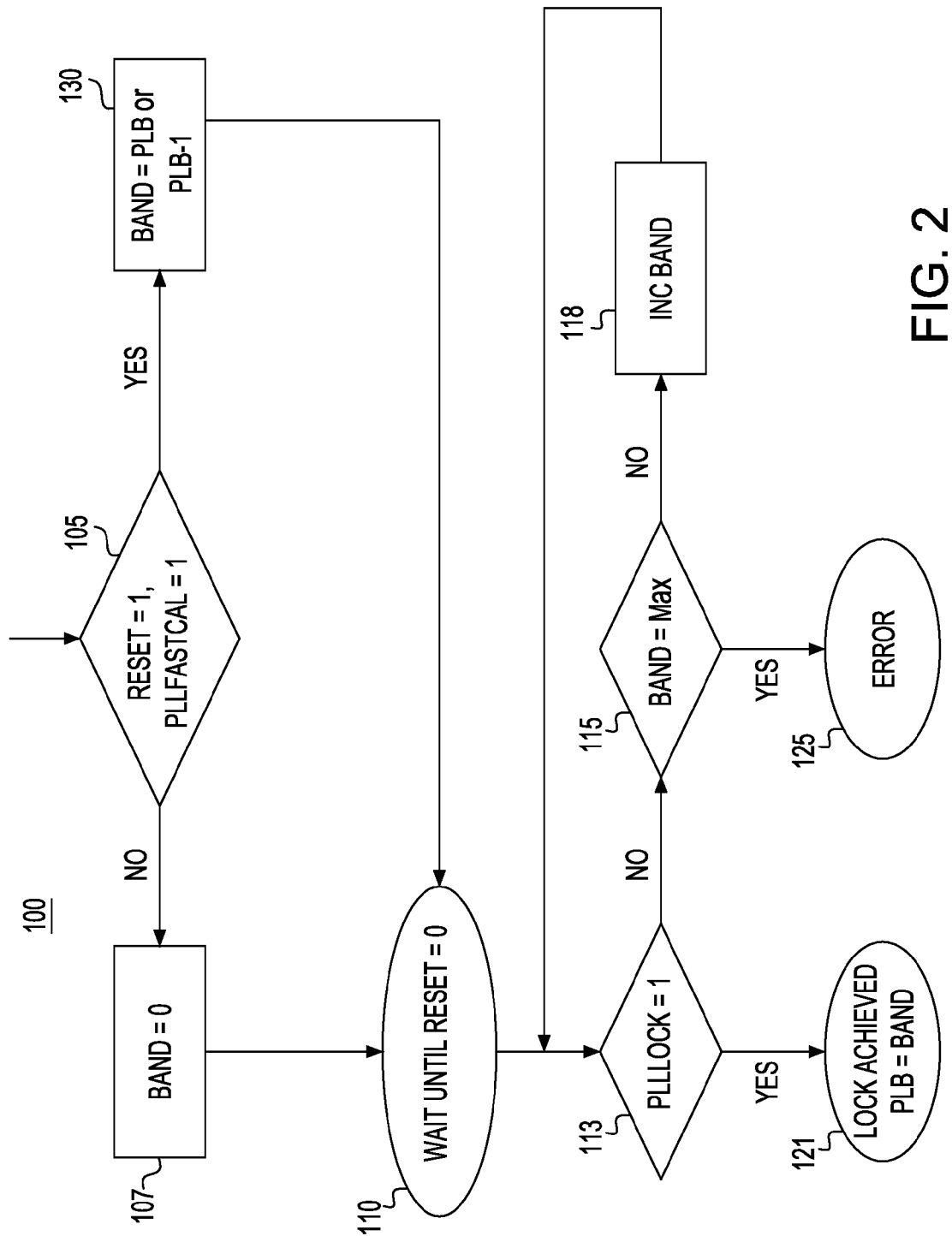
FIG. 2 shows a flow chart depicting a method 100 to reduce the PLL lock calibration time on any subsequent assertion of hard or soft reset without the intervention of the user.

FIG. 2 shows a flow chart depicting a method 100 to reduce the PLL lock calibration time on any subsequent assertion of hard or soft reset without the intervention of the user. Initially, the PLL will be in a reset state (i.e., RESET=1) until a RESET pin is de-asserted at 105. The PLL will start hunting for the lock once the RESET pin is de-asserted (i.e., RESET=0).

Initially, assuming a PLL "FASTCAL" variable indicating a calibration based on a prior locked band is not asserted (i.e., FASTCAL=0), the PLL 10 will start the search at 107 for PLL lock from lowest frequency band which is band zero 107 (i.e., BAND=0) to the highest band. Once the RESET pin is de-asserted (i.e., RESET=0) at 110, the PLL starts the search for PLL lock from lowest frequency band (e.g., BAND=zero) to the highest frequency band. At 113, a determination is made as to whether a PLL lock condition exists at a particular band (e.g., if PLLLOCK=1 condition exists). At 113, if the PLL lock condition does not exist at a current band, a determination is then made at 115 to determine if the current band is the last band (i.e., BAND=Max). If the current band is the last band, then with a lock condition not detected, an error is flagged. That is, if the band reaches maximum value, and still no PLL lock is achieved, then an error is asserted at 125. Otherwise, if the band has not reached its maximum value, then the frequency band is incremented at 118 and the process returned to step 113 in order to determine if the lock is achieved at the next incremented band (e.g., if PLLLOCK=1). Thus, steps 113 through 118 are repeated such that the PLL 10 will increment the band for every unsuccessful search of PLL lock in the particular band.

Once at 113 a PLL locking condition is determined, the desired frequency of the PLL (FLock) is calculated for each locking band. The optimum band is the one which is closest to its mid frequency (FCenter). The mid frequency is calculated by averaging a maximum frequency (FMax) and minimum frequency (FMin) of the locked band. Then the calibration exits at 121 to archive the locked state, i.e., store in a memory register a Previously Locked Band variable "PLB" with its locked band value (i.e., PLB=BAND) once the optimal locked band is found.

Thus, once the PLL 10 is in a lock achieved state the optimal band value of the PLL is recorded and stored (as PLB value) in a memory register or like memory storage structure.

Returning back to step 105, on a subsequent reset (RESET=1) applied with the FASTCAL variable input being asserted, i.e., FASTCAL=1, the PLL will start searching from the archived band to achieve the lock from the Previously Locked Band (PLB value) at 130, FIG. 2. For example, the band value with which the prior calibrated PLL got locked earlier can either be started from same band (PLB) (obtained at step 130), or from a band which is below the PLB based on VCO table reference values (e.g., PLB−1 value) so that starting band is either a locking or a non-locking band.

Thus, in one embodiment, rather than using the prior PLB band value, a PLB−1 band value may be asserted which will enable the PLL circuit 10 to implement a sweep mechanism, e.g., for detecting any changes in the temperature variations.

Figure 3:
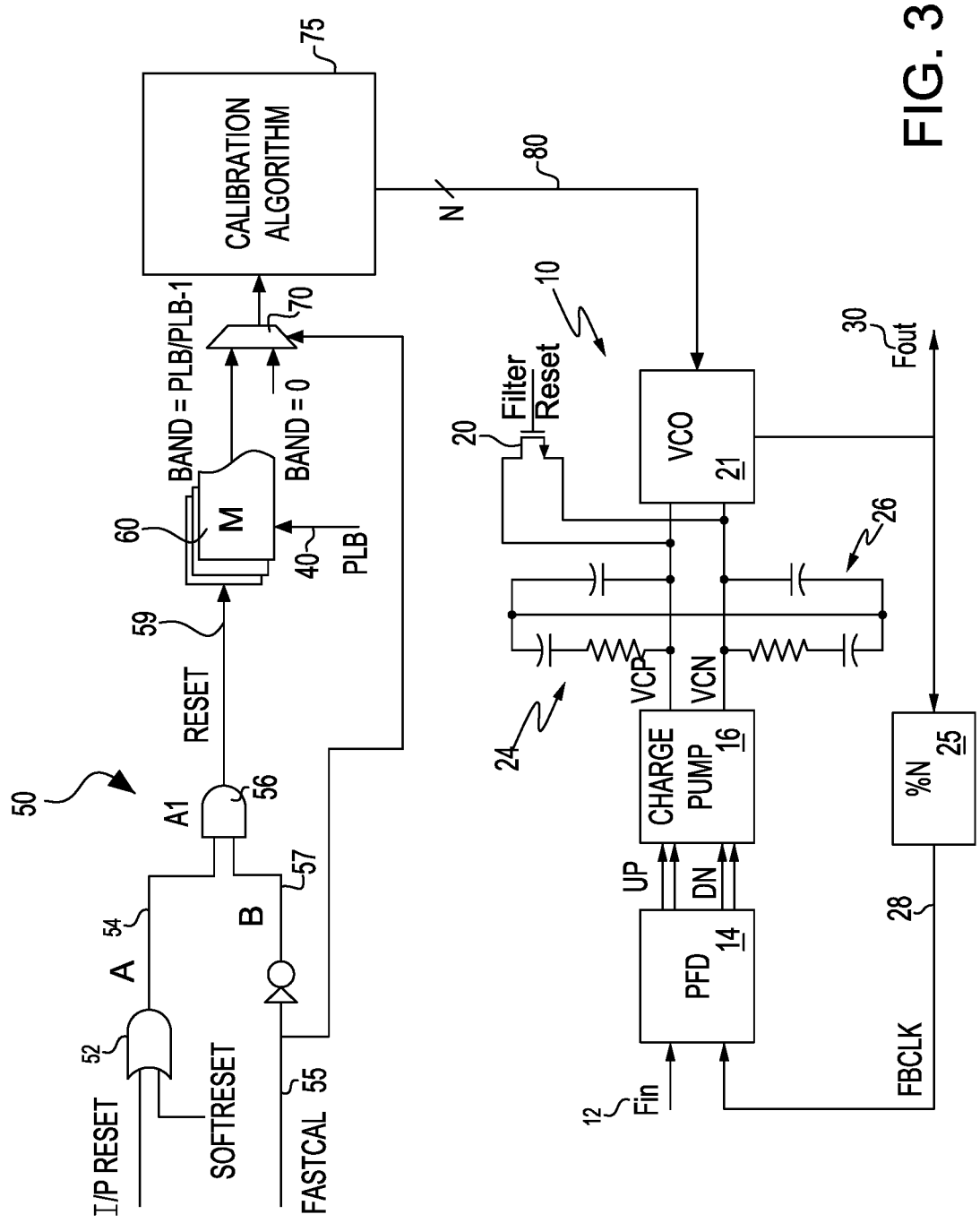
FIG. 3 shows a circuit 50 depicting a logic portion that will store the band value (PLB) in a memory register at the time of the detecting a PLL lock condition for use as a basis for the starting point in hunting the band on a subsequent recalibration.

FIG. 3 shows a circuit 50 depicting a logic portion that will store the band value (PLB) 40 in a memory register 60 at the time of the PLLLOCK, and then, via calibration algorithm, use this band value as the basis for the starting point in hunting the band on a subsequent recalibration. Due to Process, Voltage and Temperature (PVT) (e.g., physical changes of temperature and voltage), there is a possibility that the existing band value at which the previous lock was achieved may or may not be the optimal band value in the latest time interval. The proposed method will start from Previous Locked Band (PLB or PLB−1 or PLB−2 etc.) as a starting band value to address PVT changes. In this way, with voltage and temperature changes, the PLL lock can be achieved with reduced time and without user intervention when compared to a complete re-lock procedure.

In particular, FIG. 3 shows a hardware circuit 50 that connects to the analog PLL calibration circuit 10 and implements a fast calibration mechanism (FASTCAL) using logical gates. Here, circuit 50 will receive externally generated hard reset and soft reset signals at respective pins of a first OR gate 52. In one embodiment, the hard reset signal is an I/P core primary input controlled from customer logic at chip level; the Soft Reset is an internally generated signal at IP using an internal memory mapped register; and the FASTCAL signal is generated as the IP core Primary input controlled from customer logic at chip level.

AS shown in FIG. 3, the hard reset and soft reset signals are OR'ed to generate the common reset signal 54. The common reset signal 54 is input to a second gate, an AND gate 56, which also receives an inverted signal 57 of an externally generated FASTCAL input signal 55. The common reset signal 54 and inverted FASTCAL signal 57 are AND'ed at the AND gate 56 which gates asserts or de-asserts the RESET signal 59 based on the FASTCAL input 55/57. The FASTCAL signal 55 also acts as selection bit for the 2:1 multiplexer 70. The multiplexer 70 has 2 input signals: one input is the BAND adjusted values (PLB or PLB−1) and the second input is the BAND value at reset (e.g., BAND=0). The memory storage component 60 represents the memory elements which stores the BAND values 40.

Further, as can be seen in FIG. 3, a calibration engine, e.g., a processor or like controller device 75, runs a calibration logic or algorithm for achieving PLL lock and generates an N-bit digital signal 80 representing the desired frequency band. The N represents a BUS width (BAND) going from logic to the analog PLL. This N-bit BAND information is input to the VCO block 21 where it may get converted to corresponding analog voltage. Otherwise, the calibration engine may include other components to generate an analog voltage corresponding to the desired start BAND.

Figure 6:
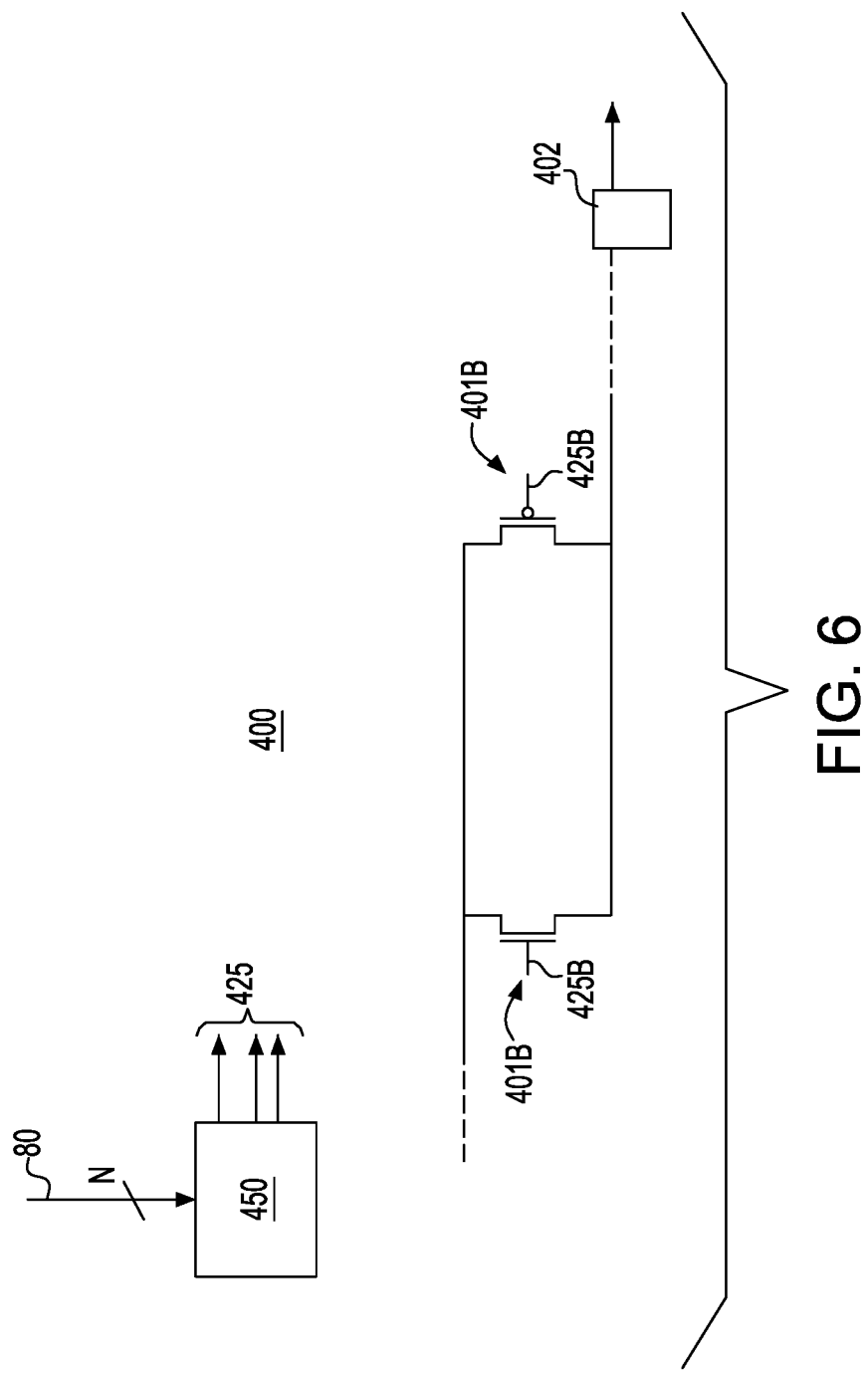
FIG. 6 shows an example analog pass gate circuit implemented in the VCO of the PLL that receives the calibration BAND signals and implements logic to switch in/out capacitors for tuning the VCO to the desired calibration starting point.

In one embodiment, the calibration BAND signal 80 of FIG. 3 actually feeds multiple switches in the form of analog pass gates such as the example pass gate 400 shown in FIG. 6 including a connection of FET devices 425A, 425B in a configuration shown. As known, multiple pass gates 400 are provided in the VCO element 21, each of which connects to a node within the VCO. Here, the pass gates are connected to a node in the VCO on one end and to capacitor(s) 402 on the other end. Each pass gate is controlled by logic device 450 to turn the pass gate(s) on, e.g., for connecting a capacitor 402 into the VCO, or for turning the pass gate(s) off, which removes the capacitor 402 from the circuit. Calibration BAND signals 80 from calibration engine 75 are multiple lines (as indicated by N) that are received at the VCO logic device 450 to output signals 425 used to select or de-select certain capacitors at the output of the VCO to hone in on the desired PLB or PLB−1 band (or lower) by selecting which capacitance (capacitors) is/are needed to be switched in to match the given band. That is, in one embodiment, the PLL bands change by adding/subtracting capacitors 402 at the VCO node as indicated by the band setting controlled by the calibration logic. In one embodiment, one band tune setting, e.g., for charge pump and filter elements (CP, filter) will support all bands. The capacitors 402 inserted or removed from the PLL system at the VCO 21 to change the bands are NCAPS (e.g., nMOS varactors). In the embodiment depicted in FIG. 6, respective ENC signal 425A, and ENT signal 425B are inverses of each other as generated by the logic 450 where each individual signal of said N signals controls a respective ENT and through a simple inverter controls the ENC pass gate control inputs to achieve the desired band.

Thus, in an embodiment, PLL logic may select an appropriate set of capacitors to place the VCO on the proper band for the particular process point and PLL oscillation speed. In an iterative fashion, the PLL converges and locks the first time and at each time the PLL is powered off and on or the PLL is reset. The storage and use of the appropriate band for the "next time" the PLL is locked to the same frequency, the same set of coefficients for the cap selection is used and a lot of time in getting the PLL to the proper frequency again is saved.

In one embodiment, the stored PLB/PLB−1 band value includes an FCenter band value that is derived directly from analog circuit feedback path. By directly knowing the FCenter from PLB/PLB−1 a significant amount of time is saved. Hence, PLL lock time in circuit 10 is further reduced.

In this embodiment, the difference between a band's mid-frequency value "FCenter" and the desired frequency value Flock is determined for each locked band. This difference is recorded as FDelta. The optimal band is one which has recorded lowest FDelta. In one embodiment, FDelta value is computed according to:

$$FDelta = ABS\{FCenter +/- FLock\} \text{ with the optimal band computed according to:}$$

$$\text{Optimal Band} = \text{Min }\{FDelta\}$$

Figure 4:
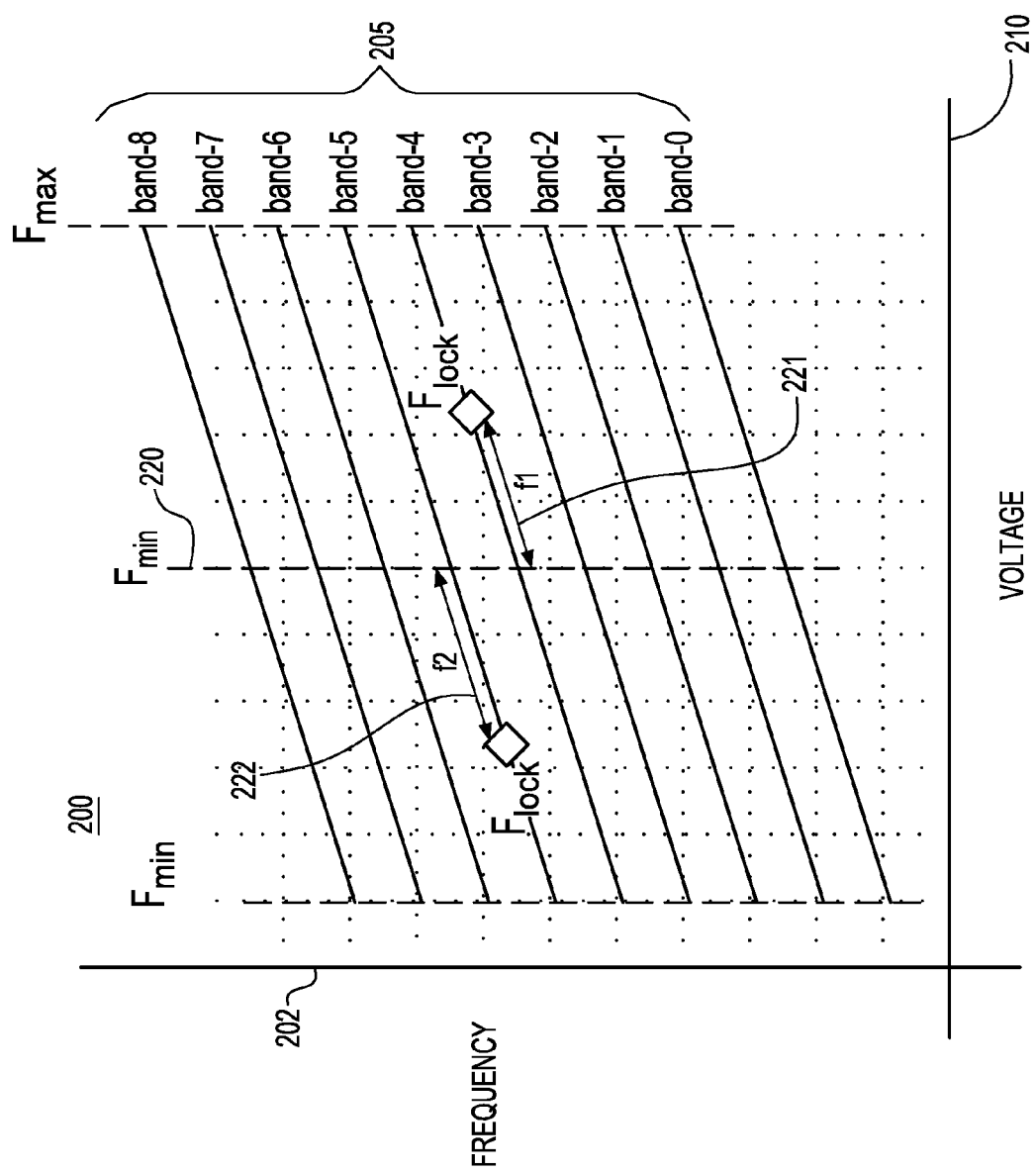
FIG. 4 depicts a graph that maps example frequencies to frequency bands plotted against required differential voltage during VCO calibration for use in selecting an optimal band for PLL lock.

FIG. 4 depicts a graph 200 that maps example frequencies 202 to frequency bands 205 plotted against required differential voltage 210 during VCO calibration for use in selecting an optimal band for PLL Lock. In the example plot 200 of FIG. 4, both the bands labeled "Band-4" and "Band-5" are locked bands. However the FDelta for Band-4 which is F1 is closer by distance 221 to FCenter 220 compared to FDelta for Band-5 which is F2 based on distance 222. Hence Band-4 is the optimal band for PLL Lock.

Figure 5:
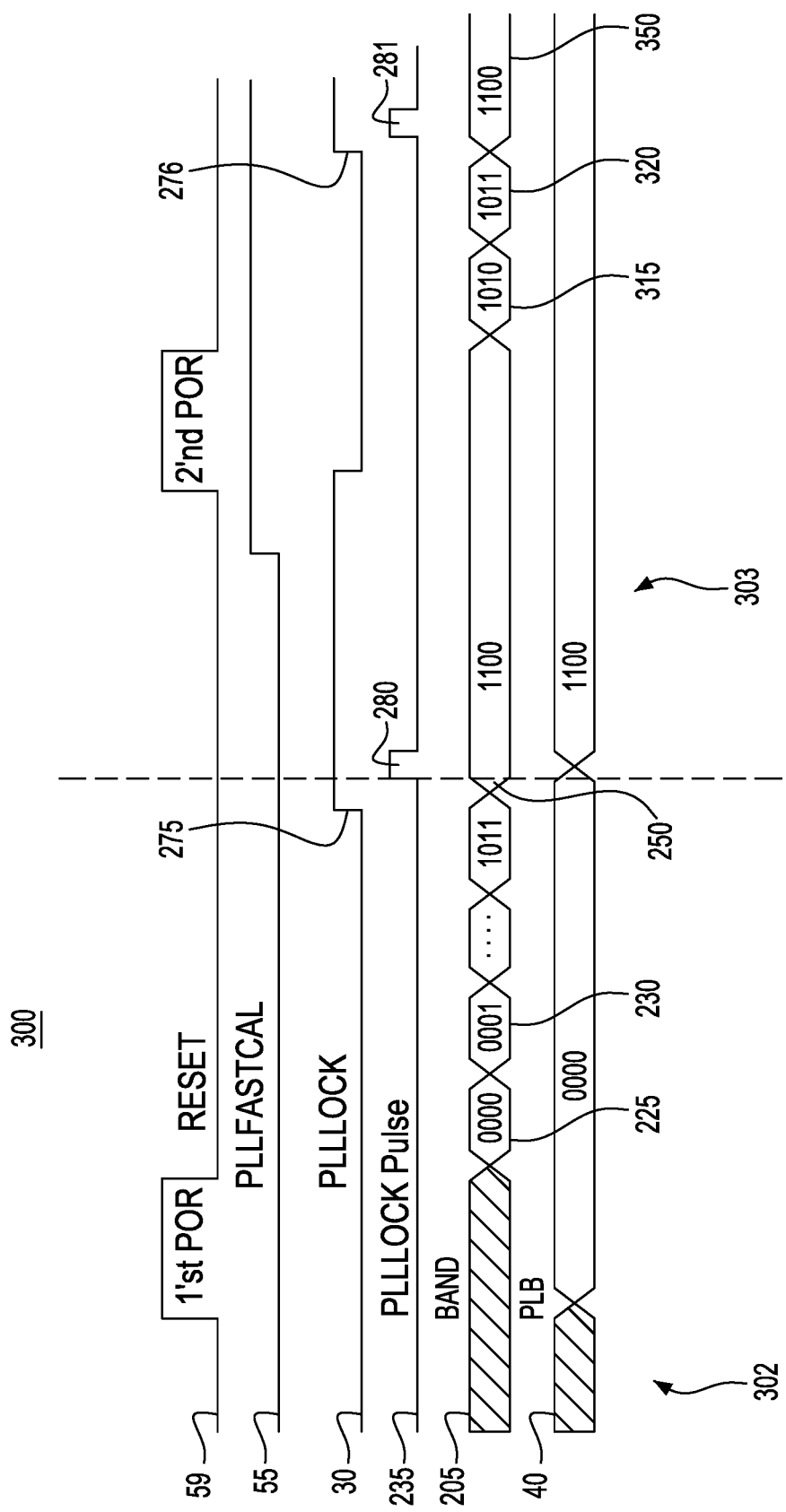
FIG. 5 depicts a timing diagram showing the timing of the signals asserted in the logic and PLL circuit shown in FIG. 3.

FIG. 5 depicts a timing diagram 300 showing the timing of the signals asserted in the logic and PLL circuit 10 shown in FIG. 3. The FIG. 5 provides a simulated result in terms of waveforms for the circuit shown in FIG. 3.

As shown in FIG. 5, there is depicted a timing of signals for a scenario 302 in which the FASTCAL signal 55 value is set to '0'; and further depicts a scenario 303 where the FASTCAL signal value is asserted '1'. In FIG. 5, in scenario 302, the RESET pulse 59 is asserted while FASTCAL is zero, thereby triggering initial incremental PLL lock calibration from the first band, e.g., BAND=0, shown at 225, a second band, e.g., BAND=1, shown at 230, etc. through a further band 250, e.g., BAND=12 (corresponding to binary 1100), where a PLL locking condition is detected at 275 indicated by a rising edge of PLLLOCK signal 30. Responsive to the PLL circuit 10 detecting a PLL locking condition at 275, a PLLLOCK pulse 280 is asserted which triggers the storing of the PLB value (a band corresponding to binary 1100 or BAND 12 in the memory location for subsequent calibration use.

FIG. 5 shows a second scenario 303 depicting the subsequent calibration performed upon in which the RESET pulse 59 is asserted a second time—however while PLLFASTCAL is asserted as value 1, thereby triggering PLL lock calibration using the PLB band stored in memory. In this example, the PLL calibrating may be set to the stored band, e.g., BAND=12 (corresponding to the binary 1100). However, due to a changed PVT condition, the PLL calibrations are swept to a prior band value, e.g., PLB−2 which corresponds to an earlier band, e.g., BAND 10 (corresponding to the binary 1010) shown at 315. (Alternatively, the PLL calibrations may be swept to an immediately prior band value, e.g., PLB−1, e.g., BAND 11 (corresponding to the binary 1011)). The PLL 10 and calibration logic running at engine 75 increments the band until a PLL lock condition exists. Here, the PLL is shown running through a second band, e.g., BAND 11 (corresponding to the binary 1011) and a next band, e.g., BAND=12 (corresponding to binary 1100) where a PLL locking condition is detected at 276. Responsive to the PLL circuit 10 detecting a lock condition at 276, the PLLLOCK pulse 281 is asserted which triggers the storing of the PLB value (a band corresponding to binary 1100 or BAND 12 in the memory location for subsequent calibration use.

Thus, referring to FIG. 3, when the chip is powered up, the reset is applied to all blocks. After the reset to PLL block is released, the calibration engine 75 initiates the hunting from the lowest available BAND to the best possible BAND for the corresponding reference clock. The BAND output from the logic to analog keeps moving up/down until the best BAND (i.e., in terms of a smallest delta) is achieved. This BAND information when fed to controller logic block 75 gets converted to a corresponding analog voltage 80 which then gets applied to the VCO 21 of PLL circuit 10 which results in getting the PLLLOCK at the desired VCO frequency.

Thus, in operation, circuits 10 and 50 and controller 75 implementing the calibration algorithm function to store the band value at the time of the PLL LOCK, and then use this band value as the basis for hunt subsequent re-calibration. Due to Process, Voltage and Temperature, PVT changes, there is the possibility that the existing band value at which the previous lock was achieved may or may not be the optimal band value in the latest time interval. The method will then start from the Previous Locked Band (PLB) or perhaps one or two bands lower (PLB−1) based on PLL characterization and modeling, as starting band value expected to address PVT changes, the PLL lock can be achieved with reduced time and without manual intervention when compared to a complete re-lock procedure.

The present disclosure provides a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A phase lock loop (PLL) calibration apparatus for phased lock loop (PLL) circuit having a voltage controlled oscillator (VCO) providing an output frequency, said apparatus comprising:
a logic circuit for setting an initial frequency band value for use in prior calibrating a PLL circuit, and iteratively incrementing said frequency band value settings for said prior PLL circuit calibrating until achieving a PLL circuit lock condition at a particular operating frequency; and
a memory storage device operably coupled to said logic circuit for storing said frequency band value setting used for achieving said PLL circuit lock condition at the particular operating frequency,
a reset signal received at said logic circuit for triggering a new PLL circuit calibration at said particular operating frequency;
a fast calibration signal received at said logic circuit and asserted to directly forward said stored frequency band value setting stored in said memory storage device to said VCO for said new PLL circuit calibration,
wherein said VCO uses said frequency band value setting from the prior PLL calibration stored in said memory storage device as said initial frequency for said new PLL circuit calibration,
wherein the PLL lock in said new calibration is achieved in a reduced amount of time.

2. The PLL calibration apparatus as claimed in claim 1, wherein said initial frequency band value setting corresponds to a base frequency band which is a lowest frequency band among a plurality of sequentially higher frequency bands to be used with said PLL circuit calibrating, said memory storage device storing said initial frequency band value setting.

3. The PLL calibration apparatus as claimed in claim 2, wherein said logic circuit receives the reset signal and a de-asserted fast calibration signal and responsively initiating, at said logic circuit, a triggering of said new calibration of said PLL circuit using the base frequency band value setting.

4. The PLL calibration apparatus as claimed in claim 2, wherein said logic circuit further comprises:
a multiplexor circuit, receiving at a first input said initial base frequency band value setting, and receiving at a second input said stored achieved frequency band value setting, said multiplexor circuit responsive to a receipt of said asserted fast calibration signal for outputting said stored achieved frequency band value setting.

5. The PLL calibration apparatus as claimed in claim 1, wherein said logic circuit, upon receiving said reset signal and an asserted fast calibration signal, responsively initiates triggering of said subsequent calibration of said PLL circuit using a frequency band value setting that corresponds to a lower frequency band than said stored prior achieved frequency band value setting, said frequency band value setting that corresponds to a lower frequency band being used as said initial frequency.

6. The PLL calibration apparatus as claimed in claim 5, wherein said stored prior achieved frequency band value setting corresponds to a frequency band N, said frequency band value setting that corresponds to a lower frequency band corresponds to a frequency band N−1 or a frequency band less than N−1.

7. The PLL calibration apparatus as claimed in claim 6, wherein for said PLL calibrating, said PLL calibration apparatus initiates a sweeping of frequency bands from a frequency band value setting corresponding to a lower frequency band N−1 setting or lower frequency band setting, and incrementing said bands in achieving a PLL lock condition from said frequency band N−1 or a lower band setting, to account for any variations in a temperature or a voltage used in said PLL circuit.

8. The PLL calibration apparatus as claimed in claim 6, further comprising: reporting an error in calibration when it is determined that a current frequency band has been stepped up to the maximum frequency band of the plurality of bands and the size of the smallest selection window is equal to a preset maximum size and without the calibration of the PLL circuit device having been completed.

9. A method of calibrating a phase lock loop (PLL) circuit having a voltage controlled oscillator (VCO) providing an output frequency comprising:
setting, at a calibration logic circuit device, an initial frequency band value for use in prior calibrating a PLL circuit, and during the prior PLL calibrating, iteratively incrementing said frequency band value settings until achieving a PLL circuit lock condition at a particular operating frequency; and
storing, in a memory storage device operably coupled to said logic circuit, said frequency band value setting used for achieving said PLL circuit lock condition at the particular operating frequency,
receiving at said logic circuit device, a reset signal for triggering a new PLL circuit calibration at said particular operating frequency;
receiving at said logic circuit device, a fast calibration signal asserted to directly forward said stored frequency band value setting stored in said memory storage device to said VCO for said new PLL circuit calibration,
wherein said VCO uses said frequency band value setting from the prior PLL calibration stored in said memory storage device as said initial frequency for said new PLL circuit calibration, wherein the PLL lock in said subsequent calibration is achieved in a reduced amount of time.

10. The method as claimed in claim 9, wherein said initial frequency band value setting corresponds to a base frequency band which is a lowest frequency band among a plurality of sequentially higher frequency bands to be used with said PLL circuit calibrating, said memory storage device storing said initial frequency band value setting.

11. The method as claimed in claim 10, further comprising:
receiving, at said calibration logic circuit device, the reset signal and a de-asserted fast calibration signal and responsively initiating, at said logic circuit, a triggering of said new calibration of said PLL circuit using the base frequency band value setting.

12. The method as claimed in claim 10, wherein said calibration logic circuit device comprises a multiplexor device, said method further comprising:
receiving, at a first input of said multiplexor device, said initial base frequency band value setting;
receiving at a second input of said multiplexor device said stored achieved frequency band value setting, and
said multiplexor device responding to receipt of said asserted fast calibration signal for outputting said stored achieved frequency band value setting.

13. The method as claimed in claim 9, wherein in response to receiving at said calibration logic circuit said reset signal and an asserted fast calibration signal, initiating triggering of said subsequent calibration of said PLL circuit using a frequency band value setting that corresponds to a lower frequency band than said stored prior achieved frequency band value setting, said frequency band value setting that corresponds to a lower frequency band being used as said initial frequency.

14. The method as claimed in claim 13, wherein said stored prior achieved frequency band value setting corresponds to a frequency band N, said frequency band value setting that corresponds to a lower frequency band corresponds to a frequency band N−1 or a frequency band less than N−1.

15. The method as claimed in claim 14, wherein said PLL calibrating comprises:
sweeping of applied frequency bands from a frequency band value setting corresponding to a lower frequency band N−1 setting or lower frequency band setting, and incrementing said bands in achieving a PLL lock condition from said frequency band N−1 or a lower band setting, to account for any variations in a temperature or a voltage used in said PLL circuit.

16. The method as claimed in claim 14, further comprising: reporting an error in calibration when it is determined that a current frequency band has been stepped up to the maximum frequency band of the plurality of bands and the size of the smallest selection window is equal to a preset maximum size and without the calibration of the PLL circuit device having been completed.

17. A computer program product for calibrating a phase lock loop (PLL) circuit having a voltage controlled oscillator (VCO) providing an output frequency comprising:
a computer readable storage medium having program instructions embodied therewith, wherein the computer readable storage medium is not a transitory signal per se, the program instructions readable by a processing circuit to cause the processing circuit to perform a method to:
set, at a calibration logic circuit device, an initial frequency band value for use in prior calibrating a PLL circuit, and during the prior PLL calibrating, iteratively increment said frequency band value settings until achieving a PLL circuit lock condition at a particular operating frequency; and
store, in a memory storage device operably coupled to said logic circuit, said frequency band value setting used for achieving said PLL circuit lock condition at the particular operating frequency,
receive at said calibration logic circuit device, a reset signal for triggering a new PLL circuit calibration at said particular operating frequency;
receive at said calibration logic circuit device, a fast calibration signal asserted to directly forward said stored frequency band value setting stored in said memory storage device to said VCO for said new PLL circuit calibration,
wherein said VCO uses said frequency band value setting from the prior PLL calibration stored in said memory storage device as said initial frequency for said new PLL circuit calibration,
wherein the PLL lock in said subsequent calibration is achieved in a reduced amount of time.

* * * * *